INTERCARRIER TELEVISION RECEIVER AFC CIRCUIT

Filed Aug. 25, 1964

INVENTOR.
PETER J.H. JANSSEN
BY
Frank R. Jifani
AGENT

INVENTOR.
PETER J.H. JANSSEN
BY
Frank R. Trifari
AGENT

March 26, 1968 P. J. H. JANSSEN 3,375,325
INTERCARRIER TELEVISION RECEIVER AFC CIRCUIT
Filed Aug. 25, 1964 3 Sheets-Sheet 3

INVENTOR.
PETER J.H. JANSSEN
BY
Frank R. Jifari
AGENT

United States Patent Office 3,375,325
Patented Mar. 26, 1968

3,375,325

INTERCARRIER TELEVISION RECEIVER AFC CIRCUIT

Peter Johannes Hubertus Janssen, Emmasingel, Eindhoven, Netherlands, assignor to North American Philips Company, Inc., New York, N.Y., a corporation of Delaware Filed Aug. 25, 1964, Ser. No. 391,856
10 Claims. (Cl. 178—5.8)

This invention relates to circuit arrangements for tuning purposes in superheterodyne television receivers of the intercarrier type, comprising an audio-channel including a first detector for separating the audio-intercarrier from the incoming television signal and at least one video-channel including a suppression filter which is tuned to the frequency of the intermediate frequency-audio carrier and which is followed by a second detector for detecting the video-signal.

Such a circuit arrangement is known from German patent specification No. 1,115,761. In this specification the signal derived from the second detector is used for tuning indication. To this end, such signal is applied to a second filter which is tuned to the frequency of the audio-intercarrier. The said filter is followed by a rectifier circuit which rectifier the signal derived from the second filter and applies it to a tuning indicator.

The operation of the tuning indication is based on the fact that, if the high-frequency portion of the television receiver is tuned correctly, the first-mentioned suppression filter substantially suppresses the incoming intermediate frequency audio-carrier. If tuning is not correct, the intermediate-frequency audio-carrier is not suppressed completely and an audio-carrier is also produced by the second detector, resulting in so-called sound in the picture. However, the said audio-intercarrier will then also be rectified and cause deflection of the tuning indicator. The sound may therefore be tuned out of the picture by manually tuning until the tuning indicator exhibits minimum deflection.

This method can be used very satisfactorily since the suppression filter determining the suppression of the audio-carrier is now also used for tuning purposes. In fact, if the said filter would vary, the point of maximum attenuation also varies but since there is also tuned to said point the incoming intermediate frequency audio-carrier is still completely suppressed.

However, if it is desired to incorporate an automatic instead of manual tuning device in the receiver then the signal derived from the said rectifier in the video-channel cannot be used for automatic frequency control without further expedients since the said signal invariably has the same polarity out of tuning. If a frequency discriminator were incorporated in the video-channel this would not provide an improvement since the audio-intercarrier produced in the video-channel if tuning is not correct still invariably has the same frequency, that is to say, the difference between the frequencies of the video-carrier and the audio-carrier.

A circuit arrangement for automatic frequency control may yet be obtained whilst retaining the first-mentioned suppression filter as a tuning-determining element if, according to the characteristic of the invention, the signal derived from the first detector as well as that from the second detector are applied to a phase detector the output terminal of which is connected to an input terminal of the reactance circuit of the high-frequency oscillator in the receiver.

In order that the invention may be readily carried into effect, a few embodiments thereof will now be described in detail, by way of example, with reference to the accompanying diagrammatic drawings, in which.

Figure 1:
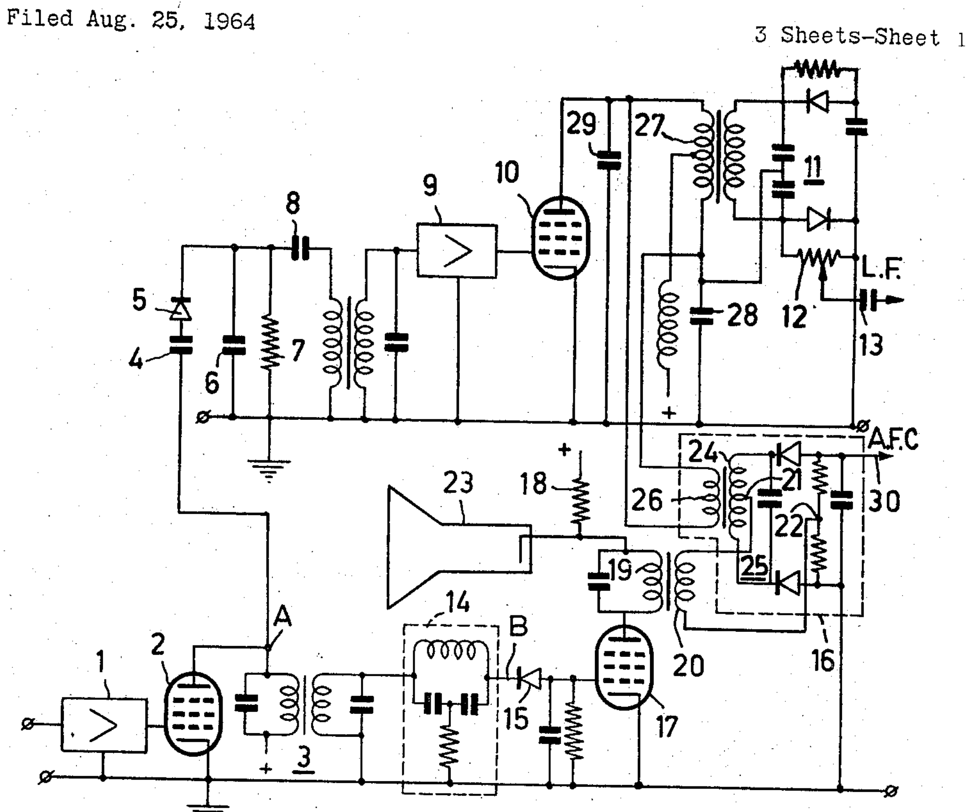
FIGURE 1 shows one embodiment of a black-white television receiver.
Figures 2, 3:
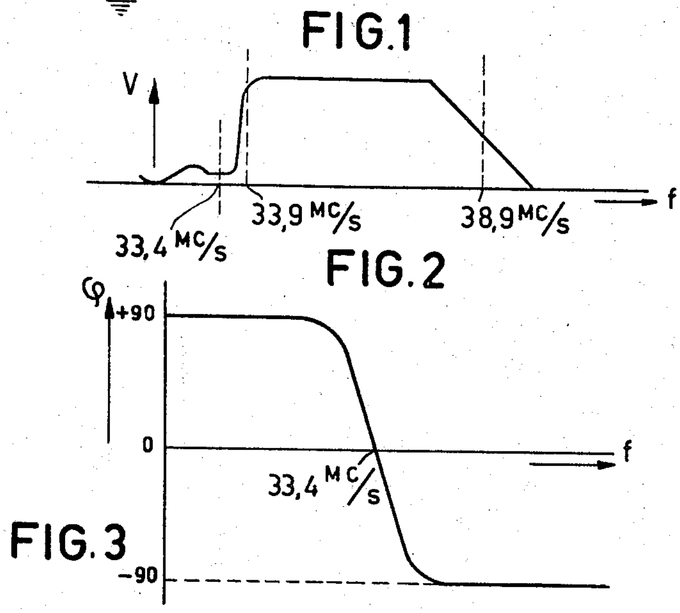
FIGURE 2 shows a frequency characteristic for a receiver of FIGURE 1.
FIGURE 3 shows a phase characteristic of the suppression filter for the intermediate frequency audio-carrier in the video-channel.

Referring now to FIGURE 1, the reference numeral 1 indicates the intermediate frequency (I.F.) amplifier of a black-white receiver in which both the I.F. video-signal and the I.F. audio-signal are amplified. The amplifier 1 is followed by the final I.F. amplifier tube 2 the output circuit of which includes a band-pass filter 3. The total I.F.-signal may be derived from the anode indicated by A and the frequency characteristic at point A will have a form as shown in FIGURE 2. From this figure it will be seen that the I.F. video-carrier has a frequency of 38.9 mc./s. and that the I.F. audio-carrier has a frequency of 33.4 mc./s. The said frequency characteristic has been given by way of example and applies to the European system in which the audio- and video-carriers are spaced apart by 5.5 mc./s. and which utilises 625 lines per image and a frame frequency of 50 c./s. It will be evident, however, that the principle of the invention is not limited to the European system and is applicable as well to the U.S. system in which the audio- and video-carriers are spaced apart by only 4.5 mc./s.

The signal derived from point A is applied, on the one hand, through a capacitor 4 to a first detector 5 which serves to produce the intercarrier signal at a frequency of 5.5 mc./s. The detector 5 is followed by a detector network comprising a capacitor 6 and a resistor 7, the signal set up across the said network being applied through a capacitor 8 to a transformer the secondary of which is tuned to a frequency of 5.5 mc./s. so that exclusively the said intercarrier signal with its frequency modulation is applied to an intercarrier amplifier 9. The amplifier 9 is followed by the final intercarrier amplifier 10 the output circuit of which includes a frequency discriminator 11, so that the low-frequency signal (L.F.) may be derived from a potentiometer 12 through a capacitor 13. The frequency discriminator 11 is of a conventional type and thus needs no further explanation.

The signal which appears at point A is also applied through the bandpass filter 3 to a filter 14, which is the aforementioned filter for suppressing the I.F. audio-carrier and which is therefore tuned to a frequency of 33.4 mc./s. This implies that the I.F. audio-carrier will be exactly 33.4 mc./s. if the high-frequency portion of the receiver is tuned correctly, the said audio-carrier thus being suppressed substantially in the filter 14. In modern receivers this suppression must be such that the attenuation is about 40 db for black-white receivers and about 60 db for colour receivers relative to the maximum value the video-signal can assume, which maximum value is illustrated by the horizontal portion of the frequency characteristic in FIGURE 2. When considering further that the attenuation must be minimum at a distance of 5 mc./s.

from the video-carrier, that is to say at a frequency of 33.9 mc./s., relative to the maximum value assumed by the video-signal, it will be clear that the steepness of the edge must be considerable between the frequencies of 33.9 mc./s. and 33.4 mc./s. Such great steepness of edge occurs at point B for the second detector 15 due to the suppression filter 14 being arranged between the points A and B. If, with wrong tuning, the audio-carrier is displaced from 33.4 mc./s. towards 33.9 mc./s. it will creep up the steep edge. From this it follows that the attenuation of 40 db for the audio-carrier rapidly decreases and that the resulting intercarrier acquires a steadily increasing amplitude because at the same time the I.F. video-carrier of 38.9 mc./s. is displaced towards higher frequencies at which the attenuation of the I.F. video-carrier is much less than that of the increase in the I.F. audio-carrier since the I.F. video-carrier is travelling along the much less steep Nyquist edge. Thus, the automatic frequency control ensures that the I.F. audio-carrier remains in the dale determined by the suppression filter 14, since in this case it will be guaranteed that no sound can occur in the picture.

As previously mentioned in the preamble, the filter 14 according to the invention is used as tuning-determining element in order to produce the voltage for the automatic frequency control. This is possible, because, according to the principle of the invention, a dual use is made of the filter 14. In fact, the filter 14 has, in addition to its suppressing properties, the property that the phase of the signal at point B will vary if the tuning of the high-frequency portion varies so that the I.F. audio-carrier passes the frequency of 33.4 mc./s. This is shown in FIGURE 3 in which the phase angle of the I.F. audio-signal is shown as a function of frequency. It is assumed that the filter 14 will give a phase shift of 0° if the I.F. audio-carrier is exactly 33.4 mc./s. and that the filter 14 will give a positive phase angle $\varphi$ if the tuning varies so that the I.F. audio-carrier assumes lower frequencies, whereas a negative phase angle $\varphi$ will be provided by the filter 14 if the I.F. audio-carrier assumes frequencies higher than 33.4 mc./s. Besides, the high sensitivity of the filter 14 will permit a very great steepness of control. Thus, the phase reversal from +90° to −90° for the filter 14 can already take place over a distance of about 10 kc./s. This implies that the frequency deviation can never be greater than 5 kc./s. 33.4 mc./s. since the maximum control voltage is already developed for such a frequency deviation.

According to the invention, by making use of this recognition, it is possible for the signal obtained from the second detector 15 to be applied to a phase detector 16 which has also applied to it the signal derived from the first detector 5.

In the embodiment shown in FIGURE 1, a dual use is made of the video-output tube 17 by using it not only for amplifying the video-signal but also for amplifying the intercarrier for tuning purposes. The anode circuit of the video-output tube 17 includes an anode resistor 18 and a circuit 19 which is tuned to the intercarrier frequency of 5.5 mc./s. Coupled to the inductance of circuit 19 is a secondary winding 20 which is included between centre tappings 21 and 22 on the phase detector 16. The video-signal proper which is applied to the cathode of a display tube 23, is developed across the anode resistor 18. However, it will be evident that the principle of the invention may be realized as well by using a separate amplifying tube to which the signal from the detector 15 is applied and which is coupled to the phase detector 16 through the winding 20.

FIGURE 1 also shows that a secondary winding 24, which forms part of a circuit 25 of phase detector 16 which is also tuned to the frequency of 5.5 mc./s., is magnetically coupled to a primary inductance 26 which is connected in parallel with a primary inductance 27 which forms part of the frequency discriminator 11 for producing the low-frequency signal. The windings 26 and 27 have inductance values such as to be tuned again together with capacitors 28 and 29, to 5.5 mc./s.

The signal at the secondary winding 24 will thus undergo a phase shift of 90° relative to the signal at the primary winding 26. Assuming the phase shift of the intercarrier signal of 5.5 mc./s. to be $\psi$ from point A to the primary winding 26, the voltage $V_{26}$ at the primary winding 26 may be written as:

$$V_{24}=V_1 \sin(\omega_g t+\psi)$$

where $V_1$ is the peak voltage of the signal transmitted through the audio-channel, $\omega_g=1\mu f_g$ with $f_g=5.5$ mc./s., $t$ is the time in seconds and $\psi$ the said phase angle. By tuning the circuit 25 to 5.5 mc./s., the signal undergoes a phase shift of 90° so that the voltage at the secondary winding 24 may be written as:

$$V_{24}=V_1 \sin(\omega_g t+\psi) \quad (1)$$

If it is ensured, when disregarding the action of the suppression filter 14, that the signal also undergoes a phase shift $\psi$ from point A to the winding 20 then the signal at the winding 20, when taking the action of the filter into account, may be written as:

$$V_{20}\ 1\ V_2 \cos(\omega_g t+\psi\pm\varphi) \quad (2)$$

wherein $V_2$ is the peak voltage of the signal transmitted through the video-channel and $\varphi$ is the phase angle provided by the filter 14. If the tuning is such that the I.F. audio-carrier is received at 33.4 mc./s. then $\psi=0$ but the peak voltage $V_2$ is also reduced substantially to 0. However, this is not objectionable since no voltage is required for the automatic frequency control (the tuning is in this case just satisfactory). Out of tuning, the peak voltage $V_2$ greatly increases owing to the very good quality of the filter 14, the change of polarity being determined by the change of polarity of the phase angle $\varphi$ as shown in FIGURE 3. In fact, the output voltage from phase detector 16 is determined by the product of the signals given by the Equations 1 and 2. If the angle $\varphi$ is positive, then:

$$V_{16}=V_1 \sin(\omega_g t+\psi)\times V_2 \cos(\omega_g t+\psi+\varphi) = -\tfrac{1}{2}V_1V_2 \sin(\varphi) \quad (3)$$

If the angle $\varphi$ is negative, this product becomes:

$$V'_{16}=V_1 \sin(\omega_g t+\varphi)\times V_2 \cos(\omega_g t+\psi-\varphi) = \tfrac{1}{2}V_vV_2 \sin\varphi \quad (4)$$

Figures 4, 5:
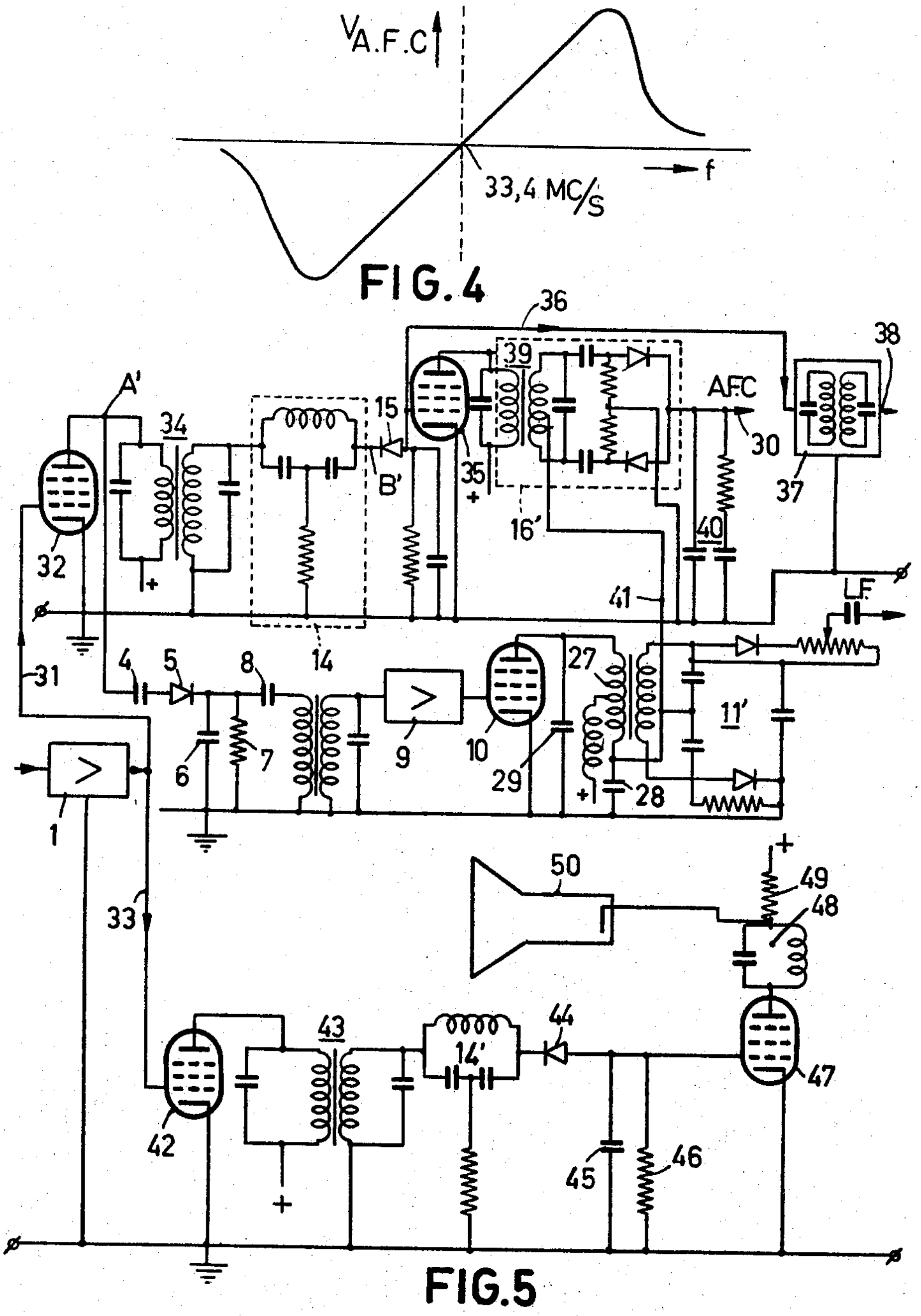
FIGURE 4 shows the output voltage as a function of the intermediate frequency of the phase discriminator arranged in accordance with the invention.
FIGURE 5 shows one embodiment of a colour television receiver.

The output signal of phase detector 16 as a function of the I.F. signal will thus have a waveform as shown in FIGURE 4. This output signal is applied as an automatic frequency control voltage (A.F.C. voltage) through a lead 30 to the reactance circuit which permits the frequency of the high-frequency oscillator to be readjusted in the high-frequency portion of the television receiver. As is well-known, when adjusting the said high-frequency oscillator, the I.F. will also vary, thereby ensuring that the correct intermediate frequencies are invariably tuned automatically.

It will be evident that the tuning is thus always readjusted so that the I.F. audio-carrier is brought to 33.4 mc./s., and hence the I.F. video-carrier to 38.9 mc./s. The system according to the invention is applicable in exactly the same manner to I.F. other than those mentioned above, which have been given only by way of example.

The A.F.C. circuit arrangement according to the invention has several advantages relative to the existing.

Firstly, as already stated in the preamble, variation of the filter 14 will not result in sound in the picture. If the filter 14 varies, for example, from 33.4 mc./s. to 33.6 mc./s. the cut-off point will also vary and the I.F. audio-carrier will be brought to 33.6 mc./s., it is true, but since the point of maximum attenuation has also exactly acquired this frequency no sound will occur in the picture.

A second advantage is that a reasonable amplification for the control circuit is permissible without involving a risk of radiation. If it is desired to obtain a reasonable steepness of control, the phase detector 16 must be capable of providing a rather high voltage. However, this will be possible only if signals of sufficient amplitude are applied to the phase detector 16. However, if the I.F. of 33.4 mc./s. or the I.F. of 38.9 mc./s. would have been used, then great amplitude signals at these frequencies when radiated back to the input of the receiver, could also penetrate to the I.F. portion of the receiver, due to the possibly poor selectively of its high-frequency poriton, and hence cause self-oscillation of the receiver. The same phenomenon occurs to an even much greater extent if the said signals are radiated back directly on parts of the I.F. portion of the receiver. According to the invention, however, the phase detector 16 operates with a signal of 5.5 mc./s. so that the risk of back-radiation, and hence the risk of self-oscillation of the receiver is greatly reduced. Another advantage is that this high amplification may be obtained with amplifiers already available in the receiver, such as the audio-intercarrier amplifiers 9 and 10 and the video-amplifier tube 17. The automatic frequency control circuit may thus be obtained merely by the provision of the phase detector 16.

A third advantage is that the intercarrier signal used for tuning purposes is invariably at 5.5 mc./s. Consequently, in the method according to the invention, if only it is ensured that both the audio-channel and the video-channel, the latter apart from the action of the filter 14, introduce the same phase angle $\psi$ into the intercarrier signal on its way from point A to the phase detector 16, a phase difference $\varphi$ occurs between the signal applied to the phase detector 16 through the audio-channel and the signal applied thereto through the video-channel, which phase difference depends only on the variation of the I.F. audio-carrier relative to the resonance frequency of the filter 14. It would be more difficult to satisfy this condition if the intercarrier signal used would not invariably have the same frequency.

In this connection it is to be noted that the frequency modulation with which the audio-signals are modulated on the audio-carrier will not detrimentally affect the operation of the arrangement since this frequency modulation will cause a varying phase angle $\varphi$ in the filter 14 indeed but the variations of $\psi$ take place at a low-frequency speed and can be sufficiently smoothed by the smoothing filter of the phase detector 16. If necessary, the lead 30 may be followed by a low-frequency filter which completely removes the low-frequency modulations from the A.F.C. voltage.

Figure 6:
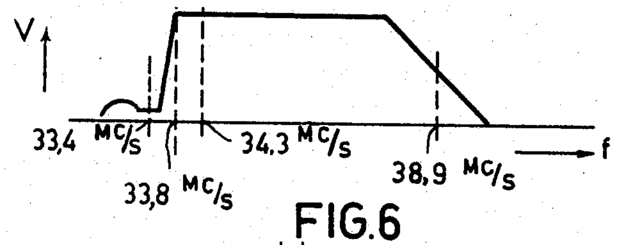
FIGURE 6 shows a frequency characteristic for the receiver of FIGURE 5.
Figure 7:
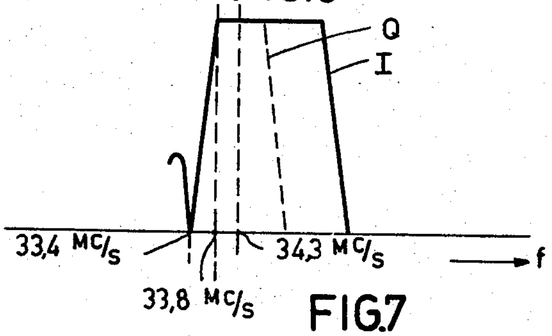
FIGURE 7 shows the frequency characteristic of the colour portion of the receiver of FIGURE 5.

If it is already important for a television receiver of the black-white type that sound in the picture is prevented this is true to an even much greater extent for a colour television receiver. This may be clarified as follows. FIGURE 6 shows a frequency characteristic of the MF portion of a colour television receiver for European standards. The characteristic shows that as before, the I.F. audio-carrier is placed on 33.4 mc./s., the I.F. video-carrier on 38.9 mc./s. and the I.F. colour subcarrier on 34.3 mc./s. Now, such a colour subcarrier is modulated in quadrature with two colour signals, namely the Q-signal having a bandwidth of about 0.5 mc./s., which is modulated as a double sideband signal on the subcarrier, and the so-called I-signal, which is modulated as a double sideband over a bandwidth of 0.5 mc./s. and, as far as the bandwidth from 0.5 mc./s. to about 1.5 mc./s. is concerned, is modulated as a single sideband signal on the subcarrier. Now it is important that these modulations of the two colour signals should not be attenuated in the receiver since otherwise cross talk of the Q-signal on the I-signal becomes possible. As a result, the frequency characteristic of the I.F.-portion continues substantially without attenuation to 33.8 mc./s. (34.3 mc./s.–0.5 mc./s.=33.8 mc./s. where the figure 0.5 mc./s. indicates the bandwidth of the double sideband portion of the colour signals). Since in this case also it is necessary that the I.F. audio-carrier in the colour channel of the colour television receiver is attenuated by 60 db relative to the maximum colour amplitude, it will be evident that the steepness of the edge of the frequency characteristic will be ever greater in the colour channel in a colour television receiver than in a black-white receiver in the video-channel. In a black-white receiver the attenuation for the audio-carrier in the video-channel need be only 40 db relative to the maximum amplitude of the video-signal and, furthermore, a certain attenuation is already permissible in this channel at a frequency of 33.9 mc./s. (see FIGURE 2), whereas in a colour receiver substantially no attenuation is allowed to occur in the colour channel even at 33.8 mc./s. This is also clarified in FIGURE 7, which shows the frequency characteristic of such a colour channel. As can readily be seen from this frequency characteristic, substantially no attenuation occurs for the signals between 34.3 mc./s. and 33.8 mc./s. Thereafter, when passing towards the frequency of 33.4 mc./s., an attenuation of 60 db must be obtained. This implies that an attenuation of 60 db must be realized through a frequency range of 0.4 mc./s. If the tuning process is such that audio-carrier shifts from 33.4 mc./s. to lower intermediate frequencies, the colour subcarrier will also shift from 34.3 mc./s. to lower frequencies so that in this case the lower sidebands of the Q- and I-signals are attenuated and hence cross talk of the Q-signal on the I-signal will occur and conversely. This is undesirable. If, however, the tuning process is such that the I.F. audio-carrier shifts to higher frequencies, the attenuation of the audio-signal will greatly decrease. For example for a detuning of 0.2 mc./s., the attenuation has already decreased from 60 db to roughly 30 db. This audio-carrier attenuated to only 30 db will then be able to be mixed in the detector circuits of the receiver with the I.F. colour subcarrier which has shifted from 34.3 mc./s. to 34.5 mc./s. and hence be able to produce a beat signal of 0.9 mc./s. Such a beat signal will be active in the colour channel as very interfering. In this case also it is therefore of utmost importance that the audio-carrier be maintained exactly in the dip of the suppression filter 14, as shown in FIGURE 5. FIGURE 5 again shows the principle of the automatic frequency control according to the invention for a colour television receiver. The I.F. amplifier 1 in this figure has a frequency characteristic as shown in FIGURE 6. A lead 31 passes from the amplifier 1 to an amplifier 32 which acts as a common I.F. amplifier for the colour signal and the audio-signal. On the other hand, a lead 33 passes from the I.F. amplifier 1 to the luminance channel in which the luminance signal $\psi$ is amplified separately.

As will be clear from what follows hereinafter, the circuit arrangement described herein utilizes three separate channels, namely a colour channel, an audio-channel and a luminance channel, but it will be evident that two such channels may be combined at will. The choice of three channels is preferable, however, in order to prevent cross talk between the audio-signals, colour signals and luminance signals.

In the embodiment shown in FIGURE 5, the colour channel takes over the function of amplifying the intercarrier signal used for producing the automatic frequency-control voltage, from the video channel as has been described with reference to the embodiment of FIGURE 1.

The MF signal derived from the lead 31 is amplified in the amplifying tube 32 so that a frequency characteristic as shown in FIGURE 6 exists at point A′ which is more or less similar to point A in FIGURE 1. The I.F. signal is now applied through capacitor 4 to the first detector 5 which again produces an intercarrier signal which reaches the audio-intercarrier amplifier 9 through the capacitor 8 and the circuit tuned to a signal of 5.5 mc./s. and, substantially, reaches the amplifying tube 10 and then the frequency discriminator 11′ which detects the low-frequency signals from the frequency-modulated signal. The only difference between the frequency discriminator 11′ of FIGURE 5 and the frequency discriminator 11 of FIGURE 1 is that the latter is designed as a frequency discriminator of the ratio-detector type whereas the frequency discriminator 11′ is of the Forster-Seeley type.

The signal derived from point A′ is applied through a bandpass filter 34 and the suppression filter 14, which in this case also is tuned to the MF audio-carrier of 33.4 mc./s., to the second detector 15 which detects the I.F. signal that is applied, on the one hand, to an additional amplifying tube 35 and, on the other, through a lead 36 to a band-pass filter 37 which is tuned to 4.6 mc./s., being the difference between the main carrier of 38.9 mc./s. and the subcarrier of 34.3 mc./s. The frequency characteristic at the output terminal 38 of the bandpass filter 37 is similar to that shown in FIGURE 7 but in which for good understanding the frequency of the subcarrier has to be decreased from 33.4 mc./s. to 4.6 mc./s. and the remaining frequencies indicated in FIGURE 7 have to be decreased by corresponding amounts. The colour signal is thus derived from the output terminal 38 and applied for further handling to those portions of the colour channel which make the said signal suitable for display in a colour display tube.

The signal amplified in the tube 35 is applied through a band-pass filter 39 to the phase detector 76′ from the output terminal 30 of which the voltage for the automatic frequency control may be derived in a similar manner as in FIGURE 1. The only difference from the embodiment of FIGURE 1 is that the phase detector 16′ is now designed as a ratio-detector and not as a Forster-Seeley detector. It is also shown that the detector 16′ is followed by a smoothing filter 40. The audio-channel and the detector 16′ are interconnected by a lead 41. It will be evident that many other methods of coupling are also possible.

FIGURE 5 also shows that the signal derived from the lead 33 is amplified on the I.F. level in an additional amplifying tube 42 and applied through a band-pass filter 43 and the suppression filter 14′, which is also tuned to 33.4 mc./s., to a detector 44 which detects, together with a capacitor 45 and a resistor 46, the I.F.-signal and applies it to a video-amplifying tube 47. The anode circuit of the video-amplifying tube 47 again includes a filter 48, which is tuned to the intercarrier frequency of 5.5 mc./s., and an anode resistor 49 across which the luminance signal Y is developed and applied to a colour display tube 50. The band-pass filter 43 is so proportioned that the colour signals cannot substantially penetrate to the luminance channel. The action of the suppression filter 14′ in the luminance channel is thus much less urgent than the action of the suppression filter 14 in the colour channel. In fact, if the audio-intercarrier penetrates to the luminance channel the consequencies will be less disastrous than if it penetrates to the colour channel since the steepness of the edge in the frequency characteristic near 33.4 mc./s. is considerably smaller in the luminance channel than in the colour channel. In the embodiment shown in FIGURE 5, the suppression filter included in the colour channel is therefore used as a determining element for producing the voltage for the automatic frequency control in a colour television receiver.

If desired, the additional amplifying tube 35 and the primary circuit of the band-pass filter 39 may be omitted and the phase detector 16 coupled directly to the circuit 48 in the anode circuit of the amplifier 47. However, in this case it is necessary that the signal applied to the first control-grid of the amplifying tube 35 in FIGURE 5 is now applied to the first control-grid of the amplifying tube 47. The operation of the arrangement is, however, the same as is the case in FIGURE 5.

Figure 8:
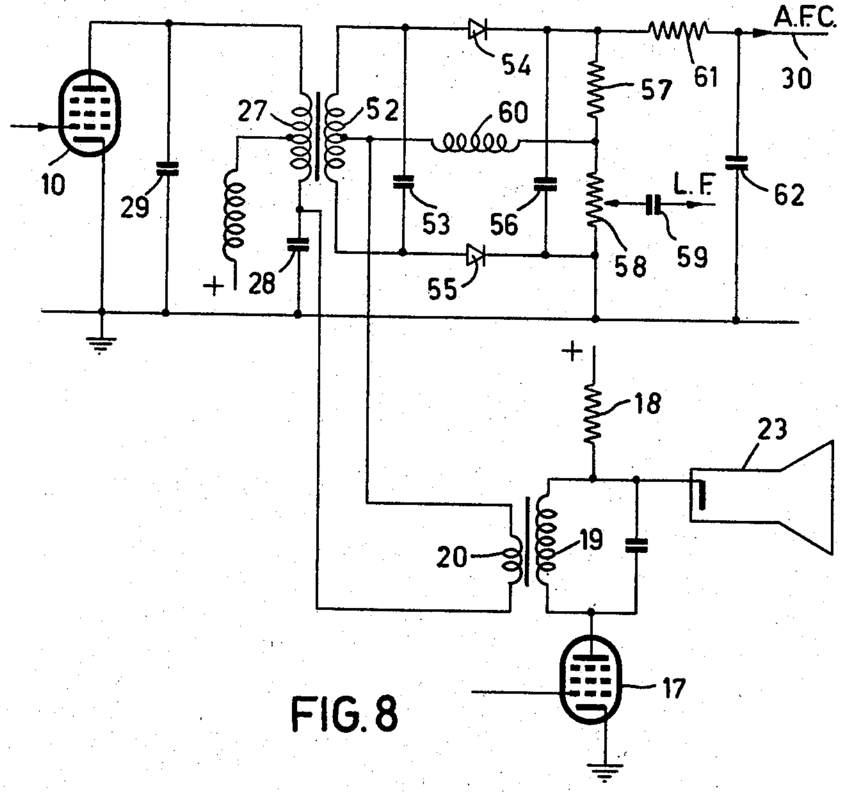
FIGURE 8 shows a portion of a circuit arrangement according to the invention in which the frequency discriminator for producing the audio-signal is combined with the phase detector according to the invention.

Although in the foregoing, reference has been made to separate frequency discriminators 11 and 11′ respectively and separate phase detectors 16 and 16′ respectively, it is also possible for the frequency discriminator and the phase detector to be combined into one unit. This is shown in FIGURE 8. In this figure, in which identical parts are indicated as far as possible by the same reference numerals as in FIGURE 1, 10 again indicates the amplifying tube for the audio-intercarrier the anode circuit of which includes the primary inductance 27 which is tuned, together with the capacitors 28 and 29, to the audio-intercarrier of 5.5 mc./s. Coupled to the inductance 27 is a secondary winding 52 which is tuned, together with a capacitor 53, to the frequency of 5.5 mc./s. The ends of the resulting circuit are connected to two diodes 54 and 55 which constitute, together with a capacitor 56 and resistors 57 and 58, a detecting network for the low-frequency sound which may be derived through a capacitor 59 from the resistor 58 which is in the form of a potentiometer. A coil 60 is included between a centre tapping on the inductance 52 and the junction point of the resistors 56 and 58, the said coil being required for completing the direct-current path of this frequency discriminator which is built up on the Forster-Seeley principle. The voltage across the capacitor 28 is applied to the centre tapping on the inductance 52 through a coil 20 which in turn is coupled to the circuit 19 included in the anode circuit of the video-amplifying tube 17. When the coil 20 is imagined in the first instance to be short-circuited the frequency discriminator operates in a conventional manner as shown in FIGURE 8, and it will be evident that the low-frequency signal is actually set up at the potentiometer 58.

However, a Forster-Seeley frequency discriminator also permits of deriving from it the voltage for the automatic frequency control. In this case the lower ends of the resistors 57 and 58 must be connected to earth and their upper ends must be connected through a smoothing resistor 61 and a smoothing capacitor 62, respectively, to the lead 30 from which the voltage for the automatic frequency control may be derived. However, in the case of the intercarrier frequency no direct voltage will be set up at the lead 30 due to the action of the frequency discriminator since the signal applied through the tube 10 invariably has, apart from its modulation, a frequency of 5.5 mc./s. True the said signal will be modulated in frequency, and hence the sum of the resistors 57 and 58 will contain a certain low-frequency component, but this low-frequency component is sufficiently filtered out by the filter 61, 62. The desired control voltage for automatic frequency control is obtained in accordance with the invention due to the frequency discriminator having also applied to it, through the coil 20, the intercarrier which reaches through tube 17 and circuit 19 the winding 20 if tuning is incorrect. The frequency discriminator will again fulfill the function of a phase detector with respect to the voltages applied through the winding 20 and the voltages which reach the winding 52 through the winding 27, so that the desired direct voltage for automatic frequency control is obtained due to the frequency discriminator in this case being operative as a phase detector. In the last-mentioned method of combining substantially no additional components are necessary for the automatic frequency control since all the components, except the coil 20, are already used for other purposes.

In conclusion, it will be evident that, although the combination of the phase detector 16 and the frequency detector 11 has been described with reference to FIGURE 8 in relation to the embodiment of FIGURE 1, another combination may be described in a similar manner which is based on the embodiment of FIGURE 5.

From the foregoing it follows that the circuit arrangement according to the invention, in addition to affording many advantages, also permits a saving in component parts with respect to those circuit arrangements in which separate frequency discriminators for automatic frequency control are provided which are controlled by means of separate circuits associated therewith, which are tuned to either 33.4 mc./s. or 38.9 mc./s. As a rule, separate amplifiers are then also required since the signals of 33.4 mc./s. or 38.9 mc./s. such as available in the receiver are not strong enough to be applied directly to a frequency discriminator for producing a voltage for automatic frequency control.

What is claimed is:

1. Means for producing a control voltage responsive to tuning in a superheterodyne signal receiver of the type adapted to receive a composite signal including a first signal modulated on a carrier wave and a second signal modulated on a subcarrier wave, said receiver comprising means for transposing the frequency of said composite signal to provide an intermediate frequency signal, first and second signal channels, means applying said intermediate frequency signal to said first and second channels, said first channel comprising suppressing filter means tuned to the frequency of said subcarrier wave in said intermediate frequency signal, and first demodulating means for demodulating the output of said suppressing filter means, said second channel comprising second demodulating means for demodulating said intermediate frequency signal and band-pass filter means tuned to the demodulated frequency of said subcarrier wave, phase detector means, means for applying output signals from said first and second demodulator means to said phase detector means and means for deriving said control voltage from said phase detector means.

2. A superheterodyne signal receiver of the type adapted to receive a composite signal including a first signal modulated on a carrier wave and a second signal modulated on a subcarrier wave, said receiver comprising means for receiving said composite signal and transposing the frequency thereof to provide an intermediate frequency signal, first and second signal channels, means applying said intermediate frequency signals to said first and second channels, said first channel comprising, in the order named, suppression filter means tuned to the frequency of said subcarrier wave in said intermediate frequency signal when said receiver is tuned correctly to receive said composite signal, first demodulator means, and first amplifier means for amplifying said first signal, said second channel comprising, in the order named, second demodulator means, and second amplifier means for amplifying said second signal modulated on said subcarrier wave, phase detector means, means for applying the output of said first and second amplifier means to said phase detector means, and means for deriving a control voltage responsive to the tuning of said receiver from said phase detector means.

3. Means for producing a control voltage responsive to tuning in a superheterodyne television receiver of the intercarrier type, said receiver comprising an intermediate frequency channel for providing an intermediate frequency television signal including a video intermediate frequency carrier wave modulated by a video signal and an intermediate frequency audio carrier wave modulated by an audio signal and separated from said video intermediate frequency carrier wave by a predetermined frequency, a video channel comprising suppression filter means tuned to the frequency of said intermediate frequency audio carrier when said receiver is correctly tuned, and first amplitude demodulator means, in that order, an audio channel comprising second amplitude demodulator means and band-pass filter means tuned to said predetermined frequency, in that order, means applying said intermediate frequency television signal to said audio and video channels, phase detector means, means applying outputs of said first demodulator means and band-pass filter means to said phase detector means, and means for deriving said control voltage from said phase detector means.

4. The means for producing a control voltage of claim 3, wherein said means applying the output of said first demodulator means to said phase detector means includes video amplifier means, and said means applying the output of said band-pass filter means to said phase detector means includes means for amplifying signals of said predetermined frequency.

5. A superheterodyne television receiver comprising a source of intermediate frequency signals including a video signal modulated on an intermediate frequency carrier and a second signal modulated on an intermediate frequency subcarrier, a sound channel and a video channel, means applying said intermediate frequency signals to said sound and video channels, said sound channel comprising first demodulator means and band-pass filter means tuned to the frequency of said intermediate frequency subcarrier connected to the output of said first demodulator means, said video channel comprising suppression filter means tuned to said frequency, and second demodulator means for demodulating the output of said suppression filter means, phase detector means, means applying the outputs of said band-pass filter means and second demodulator means to said phase detector means, and means for deriving a control voltage from said phase detector means responsive to the tuning of said receiver.

6. The receiver of claim 5, wherein said receiver is adapted to receive color television signals, and said video channel is an amplification channel for color signals.

7. A superheterodyne television receiver comprising a source of intermediate frequency signals including a video signal modulated on an intermediate frequency carrier and a sound signal modulated on an intermediate frequency subcarrier, a sound channel and a video channel, means applying said intermediate frequency signals to said sound and video channels, said sound channel comprising first demolulator means for providing a sound signal modulated on a subcarrier wave, amplifying means for amplifying said sound signal modulated on said subcarrier wave, and second demodulator means, in that order, said video channel comprising suppression filter means tuned to the frequency of said intermediate frequency subcarrier, and third demodulator means, in that order, phase detector means, means applying the output of said amplifying means and the output of said third demodulator means to said phase detector means, and means for deriving a control voltage from said phase detector means responsive to the tuning of said receiver.

8. A superheterodyne television receiver comprising a source of intermediate frequency television signals including a video signal modulated on an intermediate frequency carrier wave and a sound signal frequency modulated on an intermediate frequency subcarrier wave separated from said intermediate frequency carrier wave by a predetermined frequency, a sound channel and a video channel, means applying said intermediate frequency signals to said sound and video channels, said sound channel comprising first demodulator means for providing a sound intermediate frequency signal, means for amplifying said sound intermediate frequency signal, discriminator means for demodulating said sound intermediate frequency signal, and means for deriving a sound signal from said discriminator means, said video channel comprising suppression filter means tuned to the frequency of said intermediate frequency subcarrier wave, second demodulator means for demodulating the output of said suppression filter means to provide a video signal, and means for amplifying said video signal, phase detector means, means applying the outputs of said means for amplifying said sound intermediate frequency and said video signal to said phase detector means, and means for deriving a control voltage responsive to tuning of said receiver from said phase detector means.

9. A superheterodyne television receiver comprising a source of intermediate frequency television signals including a video signal modulated on an intermediate frequency carrier wave and a sound signal frequency modulated on an intermediate frequency subcarrier wave separated from said intermediate frequency carrier wave by a predetermined frequency, a sound channel and a video channel, means applying said intermediate frequency signals to said sound and video channels, said sound channel comprising first demodulator means for providing a sound intermediate frequency signal, means for amplifying said sound intermediate frequency signal, discriminator means for demodulating said sound intermediate frequency signal, and means for deriving a sound signal from said discriminator means, said video channel comprising suppression filter means tuned to the frequency of said intermediate frequency subcarrier wave, second demodulator means for demodulating the output of said suppresssion filter means to provide a video signal, and means for amplifying said video signal, means applying the output of said discriminator means, and means for deriving a control voltage from said discriminator means responsive to the tuning of said receiver.

10. The receiver of claim 9, in which said discriminator means comprises a transformer means having a primary winding and a secondary winding, means applying said sound intermediate frequency signal to said primary winding, first diode means, first and second resistor means, and second diode means connected serially in that order with said secondary winding, inductance means connected between a tap on said secondary winding and the junction of said first and second resistor means, a capacitor in series with said primary winding whereby a sound intermediate frequency signal appears across said capacitor, means for applying said video signal serially between the junction of said capacitor and primary winding and the tap on said secondary winding, means for deriving said sound signal from one of said resistor means, and means for deriving said control voltage from the junction of said first diode means and first resistor means.

References Cited

FOREIGN PATENTS 479,458 12/1951 Canada.

ROBERT L. GRIFFIN, *Primary Examiner.*

R. L. RICHARDSON, *Assistant Examiner.*